(12) United States Patent
Shirota et al.

(10) Patent No.: US 6,753,896 B2
(45) Date of Patent: Jun. 22, 2004

(54) LASER DRAWING APPARATUS AND LASER DRAWING METHOD

(75) Inventors: Hiroyuki Shirota, Kyoto (JP); Akira Kuwabara, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 0 days.

(21) Appl. No.: 10/300,151

(22) Filed: Nov. 20, 2002

(65) Prior Publication Data

US 2003/0112323 A1 Jun. 19, 2003

(30) Foreign Application Priority Data

Dec. 13, 2001 (JP) ......................................... 2001-380325

(51) Int. Cl.[7] ............................................... B41J 2/435
(52) U.S. Cl. ..................................... 347/236; 347/246
(58) Field of Search ................................ 347/236, 237, 347/239, 246, 247, 253, 255

(56) References Cited

U.S. PATENT DOCUMENTS 4,774,551 A * 9/1988 Amos et al. .................. 355/68
6,515,693 B1 * 2/2003 Haas et al. ................. 347/236

FOREIGN PATENT DOCUMENTS

JP 11-109273 4/1999

* cited by examiner

Primary Examiner—Hai Pham
(74) Attorney, Agent, or Firm—Ostrolenk, Farber, Gerb & Soffen, LLP

(57) ABSTRACT

A laser drawing apparatus according to the invention calibrates the accuracy of a first light quantity monitor in detecting the quantities of laser beams, based on results of detection by a second light quantity monitor of the quantities of laser beams emitted from an imaging optical system to a drawing stage, when a characteristic deterioration of or adhesion of foreign matter to optical components of the first light quantity monitor has resulted in variations in the optical characteristic of the first light quantity monitor, and variations in the detection by the first light quantity monitor of the quantities of the laser beams. The quantities of the laser beams emitted to a printed circuit board (image-receiving object) is thereby adjusted to a proper value, to maintain high-quality, high-definition drawings requiring a high degree of light quantity precision.

20 Claims, 7 Drawing Sheets

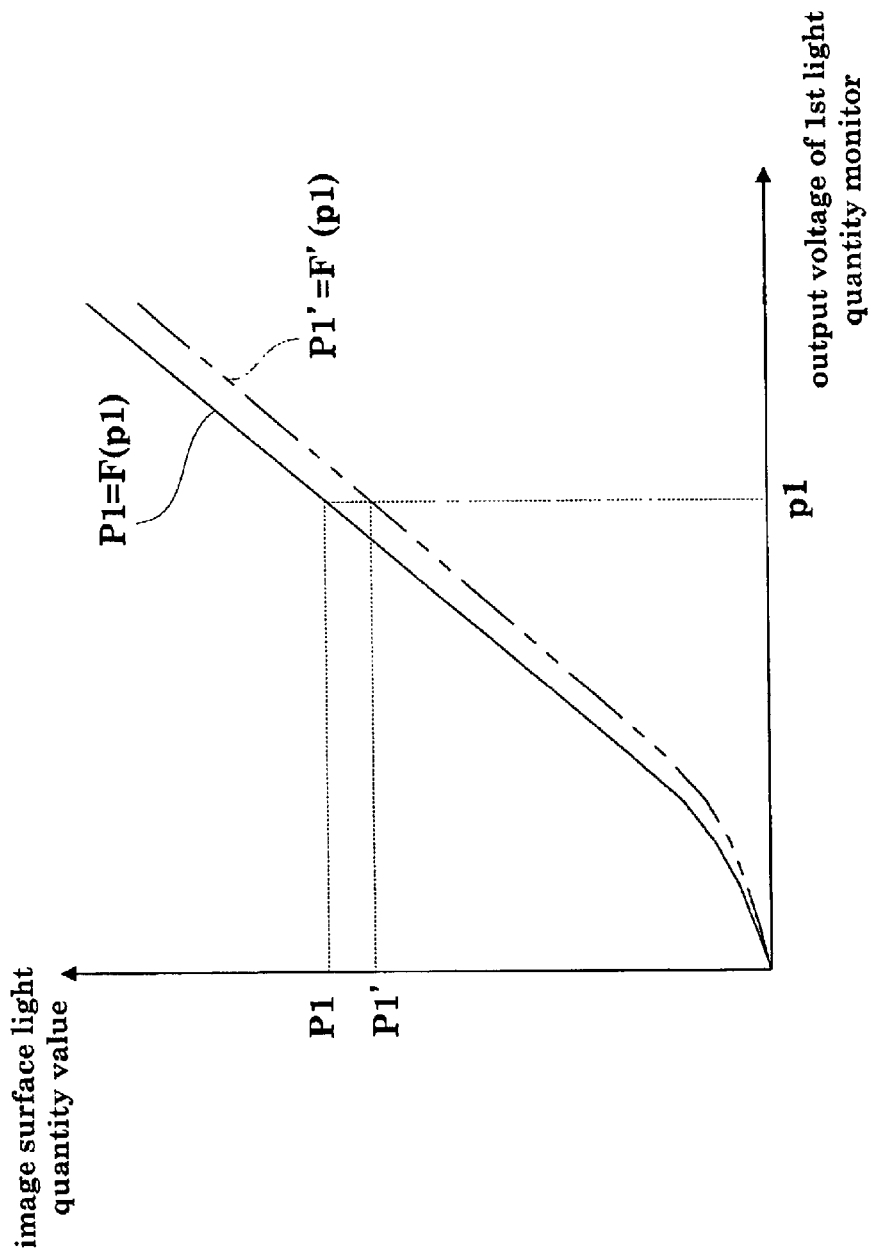

LASER DRAWING APPARATUS AND LASER DRAWING METHOD

BACKGROUND OF THE INVENTION (1) Field of the Invention

The present invention relates to a laser drawing apparatus and laser drawing method for scanning a laser beam over an image-receiving object such as a printed circuit board to draw a desired pattern on the image-receiving object. More particularly, the invention relates to a technique for calibrating a laser beam quantity detecting device in a laser beam quantity control system.

(2) Description of the Related Art

In a conventional laser drawing apparatus, an exposure head is driven to emit a laser beam modulated and deflected based on raster data toward an image-receiving object mounted on a drawing table. The laser beam scans the image-receiving object in a primary scanning direction, while the drawing table is moved in a secondary scanning direction perpendicular to the primary scanning direction. As a result, a desired pattern such as a circuit pattern is formed over an entire imaging area of the image-receiving object.

Generally, the quantity of the laser beam emitted from the exposure head is adjusted by the following two known methods.

In the first method, a beam sampler extracts part of the laser beam having undergone a quantity adjustment by a light quantity adjusting device in the exposure head, and a photo sensor detects the quantity of the extracted part of the laser beam. The light quantity adjusting device is controlled based on the result of detection provided by the photo sensor.

The second method is described in Japanese Patent Publication (Unexamined) 1999-109273. In this method, part of the laser beam emitted from the exposure head outside the imaging area of the image-receiving object is reflected by a mirror, and a photo sensor detects the reflected part of the laser beam. The light quantity adjusting device is controlled based on the result of detection provided by the photo sensor.

The conventional apparatus and methods with the above features have the following drawback.

As noted above, the beam sampler or mirror is used to separate out part of the laser beam, and the quantity of the separated part of the laser beam is detected to adjust the quantity of the laser beam emitted to the image-receiving object. However, a long period of use inevitably lowers the precision in laser drawing on image-receiving objects.

SUMMARY OF THE INVENTION

The present invention has been made having regard to the state of the art noted above, and its object is to provide a laser drawing apparatus and laser drawing method which are capable of maintaining a high degree of precision in laser drawing on image-receiving objects.

To fulfill the above object, Inventors have made intensive research and attained the following findings. Part of a laser beam is separated out by an optical system to detect the quantity of the laser beam with a light quantity detecting device. For this purpose, the light quantity detecting device includes an optical component such as a beam sampler or mirror as noted above. A light-receiving portion of such optical component undergoes a gradual deterioration in its coating due to the power of the incident laser beam. Further, fine particles of foreign matter may adhere to the light-receiving portion. The deterioration of the light-receiving portion or the adhesion thereto of foreign matter results in variations in the separation ratio and optical efficiency of the beam sampler, or variations in the reflectivity of the mirror. Such variations are found to have a causal relationship with the inability to detect the quantity of the laser beam accurately, and therefore the laser beam is not emitted in a proper quantity to image-receiving objects, resulting in a low precision of laser drawing on the image-receiving objects.

Based on the above findings, the present invention provides a laser drawing apparatus for drawing a desired pattern on an image-receiving object by scanning the object with a laser beam, the apparatus comprising:

a holding device for holding the image-receiving object;

an exposing device having a light quantity adjusting device for adjusting quantity of the laser beam, an extracting device for extracting at least part of the laser beam in the quantity adjusted by the light quantity adjusting device, and a first light quantity detecting device for detecting quantity of the laser beam extracted by the extracting device, the laser beam in the quantity adjusted by the light quantity adjusting device being scanned in a primary scanning direction over the image-receiving object held by the holding device;

a moving device for moving the holding device relative to the exposing device in a secondary scanning direction perpendicular to the primary scanning direction;

a drawing control device for controlling the exposing device and the moving device;

a second light quantity detecting device disposed on the holding device for directly detecting the quantity of the laser beam emitted from the exposing device toward the holding device; and a calibrating device for calibrating the first light quantity detecting device based on results of detection by the first light quantity detecting device and results of detection by the second light quantity detecting device.

According to the apparatus of the invention, the exposing device includes a light quantity adjusting device for adjusting quantity of the laser beam, an extracting device for extracting at least part of the laser beam in the quantity adjusted by the light quantity adjusting device, and a first light quantity detecting device for detecting quantity of the laser beam extracted by the extracting device. The laser beam in the quantity adjusted by the light quantity adjusting device is scanned in the primary scanning direction over the image-receiving object held by the holding device. The moving device moves the holding device relative to the exposing device in the secondary scanning direction perpendicular to the primary scanning direction. The drawing control device controls the exposing device and the moving device. The second light quantity detecting device is disposed on the holding device, and directly detects quantities of the laser beam emitted from the exposing device toward the holding device. The calibrating device calibrates the first light quantity detecting device based on results of detection by the first light quantity detecting device and results of detection by the second light quantity detecting device.

Thus, even when variations occur in the optical characteristic of the extracting device which extracts at least part of the light beam in the adjusted light quantity, or when foreign matter adheres to the extracting device and causes variations in the light guiding efficiency in guiding the extracted laser beam from the extracting device to the first light quantity detecting device, resulting in variations in the light quantity detecting accuracy of the first light quantity detecting device, the accuracy of the first light quantity detecting device in detecting the quantity of the laser beam based on results of detection by the second light quantity detecting device of the quantity of the laser beam emitted to the image-receiving object. Thus, the quantity of the laser beams emitted to the image-receiving object may be adjusted to a proper value, to maintain high-quality, high-definition drawings requiring a high degree of light quantity precision.

Preferably, the second light quantity detecting device is disposed in an imaging area on the holding device. The laser beam emitted from the exposing device impinges upon the second light quantity detecting device inside the imaging area on the holding device. The second light quantity detecting device detects the quantity of the laser beam. Thus, where the second light quantity detecting device is disposed outside the imaging area on the holding device, the primary scanning range of the laser beam must be enlarged so that the laser beam directly enters the second light quantity detecting device. This requires a large lens and large deflector to be used in the exposing device for scanning the laser beam in the primary scanning direction relative to the image-receiving object supported by the holding device. According to the invention, the second light quantity detecting device is disposed inside the imaging area on the holding device, and thus no need to enlarge the primary scanning range of the laser beam to direct the beam to the second light quantity detecting device. This avoids the enlargement of the lens and deflector used in the exposing device.

Preferably, the exposing device is a device for emitting a plurality of laser beams toward the image-receiving object held by the holding device. The drawing control device is arranged to control the exposing device and the moving device for directing the laser beams, one by one, to the first light quantity detecting device and the second light quantity detecting device. The first light quantity detecting device and the second light quantity detecting device are arranged to detect quantities of the laser beams, one by one, respectively. The calibrating device is arranged to calibrate the first light quantity detecting device for each of the laser beams based on results of detection of each of the laser beams detected by the first light quantity detecting device and the second light quantity detecting device. Thus, the accuracy of the first light quantity detecting device in detecting the quantities of the laser beams may be calibrated also in the laser drawing apparatus for performing multi-beam drawing by scanning a plurality of laser beams over the image-receiving object supported by the holding device. The quantities of the laser beams emitted to the image-receiving object may be adjusted to a proper value, to maintain high-quality, high-definition drawings requiring a high degree of light quantity precision.

Preferably, the calibrating device is arranged to determine whether a difference between a first light quantity value detected by the first light quantity detecting device and a second light quantity value detected by the second light quantity detecting device exceeds a permissible value, and to calibrate the first light quantity detecting device when the permissible value is exceeded. Thus, whether a calibration is necessary or not may be determined simply.

In another aspect of the invention, a laser drawing method is provided for drawing a desired pattern on an image-receiving object by scanning the object with a laser beam, the method comprising:

a first detecting step for operating an extracting device to extract at least part of the laser beam in a quantity adjusted by a light quantity adjusting device, and operating the first light quantity detecting device to detect quantity of the extracted part of the laser beam;

a light quantity adjusting step for adjusting the light quantity adjusting device based on results of detection obtained in the first detecting step;

a second detecting step for operating a second light quantity detecting device to detect directly a substantive quantity of the laser beam reaching the image-receiving object after the quantity is adjusted by the light quantity adjusting device; and a calibrating step for calibrating the light quantity adjusting step based on results of detection obtained in the first detecting step and the second detecting step.

According to the method of the invention, the first detecting step is executed for operating the extracting device to extract at least part of the laser beam in a quantity adjusted by a light quantity adjusting device, and operating the first light quantity detecting device to detect quantity of the extracted part of the laser beam. In the light quantity adjusting step, the light quantity adjusting device is adjusted based on results of detection obtained in the first detecting step. In the second detecting step, the second light quantity detecting device is operated to detect directly a substantive quantity of the laser beam reaching the image-receiving object after the quantity is adjusted by the light quantity adjusting device. In the calibrating step, the light quantity adjusting step is calibrated based on results of detection obtained in the first detecting step and the second detecting step.

Thus, even when variations occur in the optical characteristic of the extracting device which extracts at least part of the light beam in the adjusted light quantity, or when foreign matter adheres to the extracting device and causes variations in the light guiding efficiency in guiding the extracted laser beam from the extracting device to the first light quantity detecting device, resulting in variations in the light quantity detecting accuracy of the first light quantity detecting device, the accuracy of the first light quantity detecting device in detecting the quantity of the laser beam based on results of detection by the second light quantity detecting device of the quantity of the laser beam emitted to the image-receiving object. Thus, the quantity of the laser beams emitted to the image-receiving object may be adjusted to a proper value, to maintain high-quality, high-definition drawings requiring a high degree of light quantity precision.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

FIG. 8 is a view illustrating a relationship between image surface light quantity value and output voltage of the first light quantity monitor.

DESCRIPTION OF THE PREFERRED EMBODIMENTS

A preferred embodiment of the present invention will be described in detail hereinafter with reference to the drawings.

Figure 1:
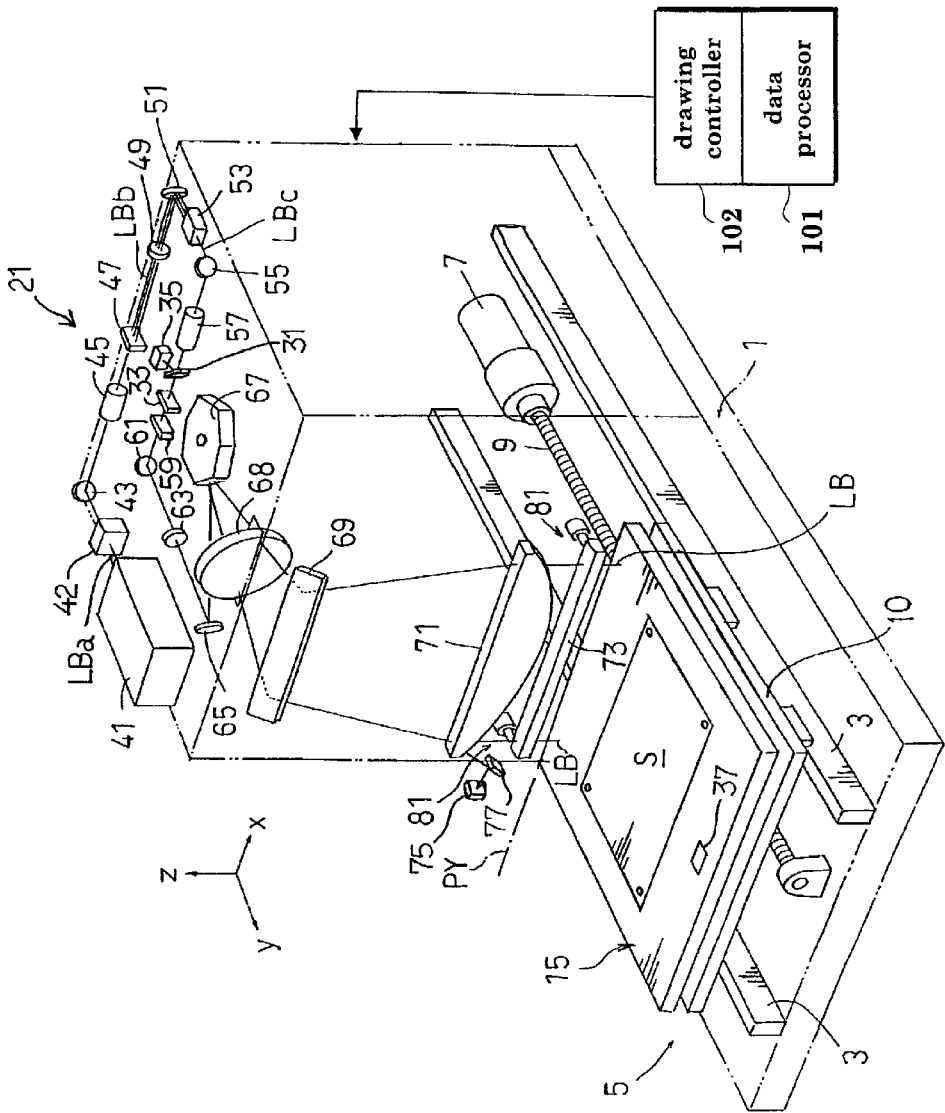
FIG. 1 is a perspective view showing an outline of a laser drawing apparatus according to the invention.

FIG. 1 is a perspective view showing an outline of a laser drawing apparatus according to the invention.

As shown in FIG. 1, the laser drawing apparatus in this embodiment, broadly, includes a drawing stage 5 for supporting a printed circuit board (image-receiving object) S with a sensitive material applied thereto, an imaging optical system 21 including a polygon mirror 67 and an fθ lens 68 for deflecting drawing laser beams LB in a primary scanning direction (x-direction), a moving mechanism for moving the drawing stage 5 in a secondary scanning direction (y-direction), a data processor 101 for processing artwork data of the printed circuit board designed by using CAD (Computer Aided Design), and a drawing controller 102 for controlling drawing based on data received from the data processor 101.

The moving mechanism for the drawing stage 5 is constructed as follows. This apparatus has a base 1 with a pair of guide rails 3 arranged on an upper surface thereof. A feed screw 9 is disposed between these guide rails 3 to be rotatable by a servo motor 7. The drawing stage 5 is meshed in a lower position thereof with the feed screw 9. The drawing stage 5 includes a stage base 10 slidable along the guide rails 3, and a support table 15 for supporting the printed circuit board S by suction.

The above drawing stage 5 corresponds to the holding device of this invention. The moving mechanism including the above guide rails 3, servo motor 7 and feed screw 9 corresponds to the moving device of this invention.

In the y-direction (secondary scanning direction) in which the drawing stage 5 is moved by the servo motor 7, the imaging optical system 21 is disposed for emitting the drawing laser beams LB downward to a processing position PY, while deflecting the laser beams LB in the x-direction (primary scanning direction). The imaging optical system 21 is supported above the base 1 by a gate-shaped frame. The servo motor 7 is operable to move the drawing stage 5 back and forth relative to the imaging optical system 21.

The construction of imaging optical system 21 will be described next.

A laser source 41 is, for example, a solid laser of 532 nm wavelength using a semiconductor as an excitation source. A laser beam LBa exiting this laser source 41 is inputted to a light quantity adjusting unit 42 where the quantity of light is adjusted before being outputted therefrom. The laser beam LBa with the quantity of light adjusted in and outputted from the light quantity adjusting unit 42 is deflected substantially 90° by a corner mirror 43 to enter a beam expander 45. The laser beam LBa adjusted to a predetermined beam diameter by the beam expander 45 is divided by a beam splitter 47, for example, into eight laser beams LBb (omitted from FIG. 1). The eight laser beams LBb travel by way of a condenser lens 49 and a corner mirror 51 and enter an acousto-optical modulator (AOM) 53 in a collimated state. The laser beams LBb form images in the crystal inside the acousto-optical modulator 53, and are each independently modulated based on raster data by a control signal from the drawing controller 102 to be described hereinafter. The acousto-optical modulator 53 is operable to adjust the quantity of each laser beam LBb so that the eight laser beams LBb have a uniform quantity of light. The above light quantity adjusting unit 42 and acousto-optical modulator 53 constitute the light quantity adjusting device of this invention.

The laser beams LBc modulated by the acousto-optical modulator 53 are reflected by a corner mirror 55 to enter a relay lens assembly 57. The laser beams LBc exiting the relay lens assembly 57 are led to a beam sampler 31. Most of the laser beams LBc incident on the beam sampler 31 are transmitted through the beam sampler 31, and travel through a shutter element 33 to a cylindrical lens 59. Part of the incident laser beams LBc are separated and extracted by the beam sampler 31 to travel toward a first light quantity monitor 35 to be described hereinafter. The above beam sampler 31 corresponds to the extracting device of this invention.

The shutter element 33 disposed downstream of the beam sampler 31 is operable upon instructions from the drawing controller 102 to output, or stop the output of, the laser beams LBc emerging from the beam sampler 31 to the cylindrical lens 59.

The laser beams LBc incident on the cylindrical lens 59 are led by a corner mirror 61, a spherical lens 63 and a corner mirror 65 to the polygon mirror 67. On each surface of the polygon mirror 67, the laser beams LBc form linear spots extending in the primary scanning direction (x-direction).

The linear laser beams LBc deflected in a horizontal plane by rotation of the polygon mirror 67 travel through the fθ lens 68, are then directed downward by a deflecting mirror 69 elongated in the primary scanning direction. The laser beams LBc, after being corrected by a field lens 71 to be incident on an exposure plane substantially at right angles thereto, travel through a cylindrical lens 73 toward the support table 15.

The cylindrical lens 73 is elongated in the primary scanning direction, and has an index of refraction in a direction for forming images (direction for reduction exposure) only in the secondary scanning direction. The cylindrical lens 73 is disposed to have a cylindrical surface facing upward. Position correcting mechanisms 81 are disposed at opposite ends of the cylindrical lens 73, respectively, for moving the cylindrical lens 73 in the secondary scanning direction (y-direction). A scan position itself may be moved by moving the opposite ends of the cylindrical lens 73 independently of each other in the secondary scanning direction (y-direction).

By the action of fθ lens 68, field lens 71 and cylindrical lens 73, the linear spots on the polygon mirror 67 noted above form spots of predetermined diameter on the support table 15. Thus, with rotation of the polygon mirror 67, the laser beams LB (at most eight laser beams) are formed that move in the primary scanning direction (x-direction).

A mirror 77 is disposed between the field lens 71 and cylindrical lens 73 for directing the laser beams to a start sensor 75. The mirror 77 reflects, obliquely upward toward the start sensor 75, the laser beams LB having passed through the field lens 71 and immediately before reaching a drawing start position. The start sensor 75 detects a start of scanning of the laser beams in the primary scanning direction (x-direction). A scan start signal outputted from the start sensor 75 is applied to the drawing controller 102 to start a drawing operation upon lapse of a predetermined time from receipt of the scan start signal.

The above imaging optical system 21 corresponds to the exposing device of this invention.

Figure 2:
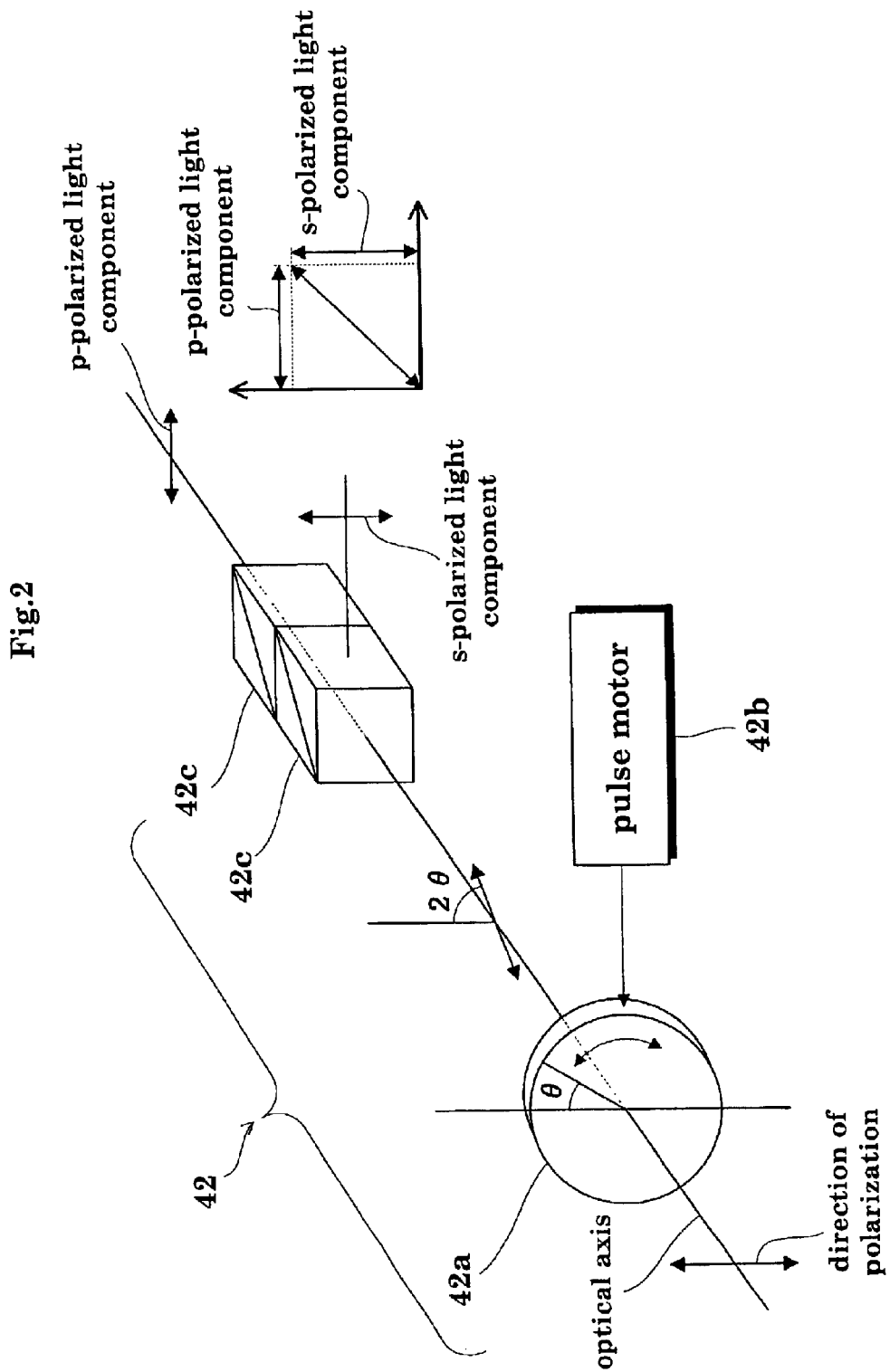
FIG. 2 is an explanatory view illustrating the principle of a light quantity adjustment by a light quantity adjusting unit.

Next, the construction of the light quantity adjusting unit 42 noted above will be described in detail with reference to FIG. 2. FIG. 2 is an explanatory view illustrating the principle of a light quantity adjustment by the light quantity adjusting unit 42.

As shown in FIG. 2, the light quantity adjusting unit 42 includes a halfwave plate 42a, a pulse motor 42b for rotating the halfwave plate 42a about an optical axis, and two polarization beam splitters 42c. The light quantity adjusting unit 42 outputs the laser beam LBa adjusted to a predetermined quantity of light under control of the drawing controller 102 described hereinafter. The two polarization beam splitters 42c each transmit only a p-polarized light component of the laser beam, and are arranged in series immediately downstream of the halfwave plate 42a. When the halfwave plate 42a is rotated about the optical axis, the direction of polarization of the laser beam rotates twice the rotating angle about the optical axis, to vary the quantity of the p-polarized light component transmitted through the two polarization beam splitters 42c. In this way, the quantity of the laser beam LBa is adjusted and outputted. Although the two polarization beam splitters 42c are used to obtain a large extinction ratio, only one polarization beam splitter may be used.

Figure 3:
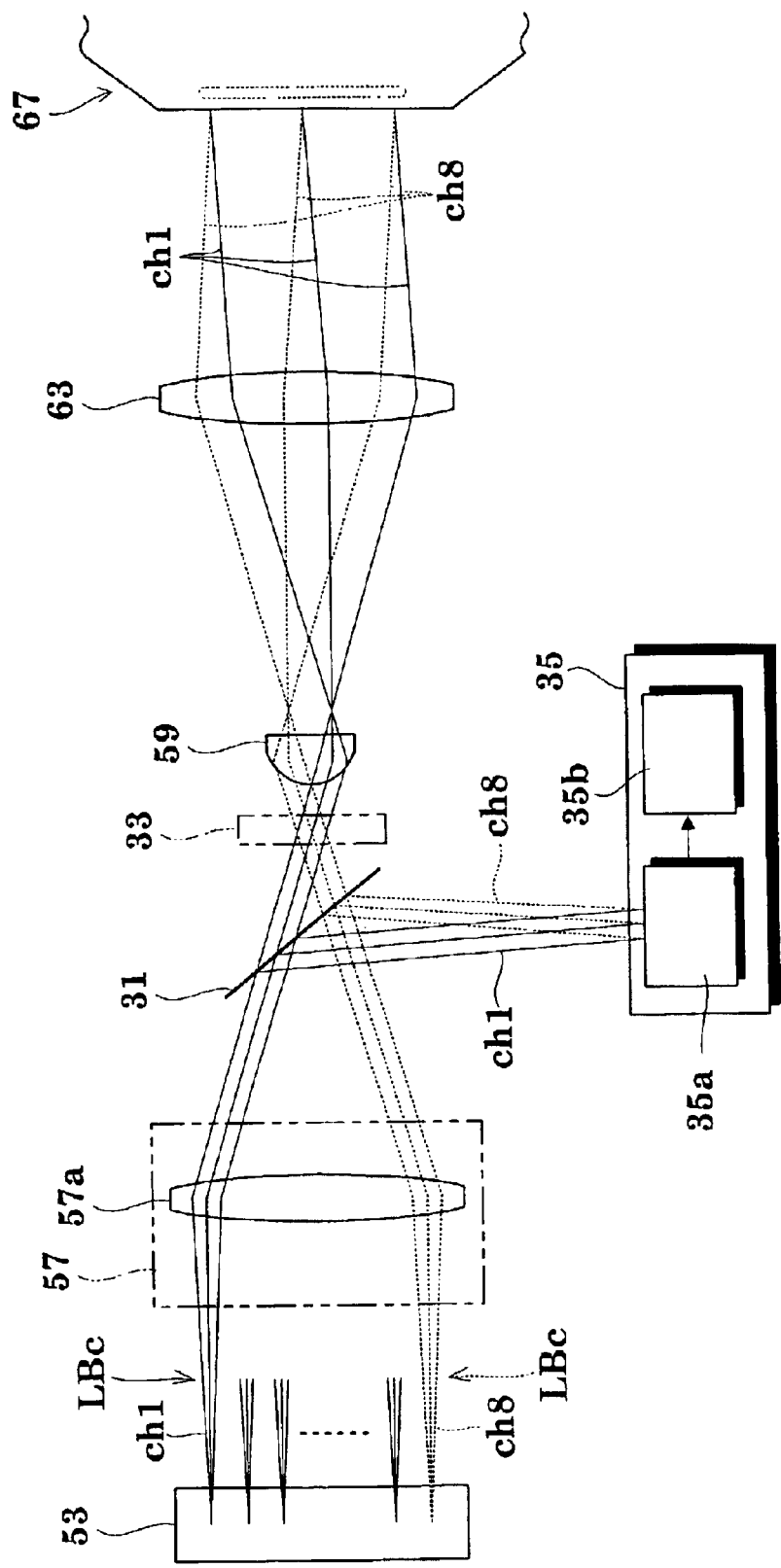
FIG. 3 is an explanatory view illustrating an optical path from an acousto-optical modulator to a polygon mirror and the construction of a first light quantity monitor.

Next, an optical path from the acousto-optical modulator 53 to the polygon mirror 67, and the construction of the first light quantity monitor 35 will be described in detail with reference to FIG. 3. FIG. 3 is an explanatory view illustrating the optical path from the acousto-optical modulator 53 to the polygon mirror 67 and the construction of the first light quantity monitor 35.

As shown in FIG. 3, the eight laser beams LBc modulated by and output from the acousto-optical modulator 53 enter the relay lens assembly 57 and are emitted from a spherical lens 57a in the relay lens assembly 57 to the beam sampler 31, respectively. The beam sampler 31 transmits approximately 99% of the quantity of each of the eight incident laser beams LBc, and separates, and outputs to the first light quantity monitor 35, approximately 1% of each of the eight incident laser beams LBc as eight light quantity monitoring beams. The eight light quantity monitoring beams are extracted as deflected at right angles. The first light quantity monitor 35 is disposed adjacent a position where principal rays of the eight light quantity monitoring beams converge. In this way, the eight light quantity monitoring beams are detected in the same position of the first light quantity monitor 35. The eight laser beams LBc transmitted through the beam sampler 31 are directed by the shutter element 33, cylindrical lens 59 and spherical lens 63 to the polygon mirror 67, and form linear spots (shown in broken lines) extending in the primary scanning direction (x-direction) on the polygonal surfaces of the polygon mirror 67. On the polygonal surfaces of the polygon mirror 67, the eight linear sports are arranged in the direction perpendicular to the plane of FIG. 3, to correspond to the respective channels of the laser beams LBc.

As shown in FIG. 3, the first light quantity monitor 35 includes, for example, a photodiode sensor 35a and an analog-to-digital converter 35b. The photodiode sensor 35a receives the laser beams LBc, and outputs voltages converted from the intensities thereof. The voltages outputted are digitized by the analog-to-digital converter 35b, and outputted to a light quantity computing unit 89 (FIG. 4) to be described hereinafter. The above first light quantity monitor 35 corresponds to the first light quantity detecting device of this invention.

Figure 4:
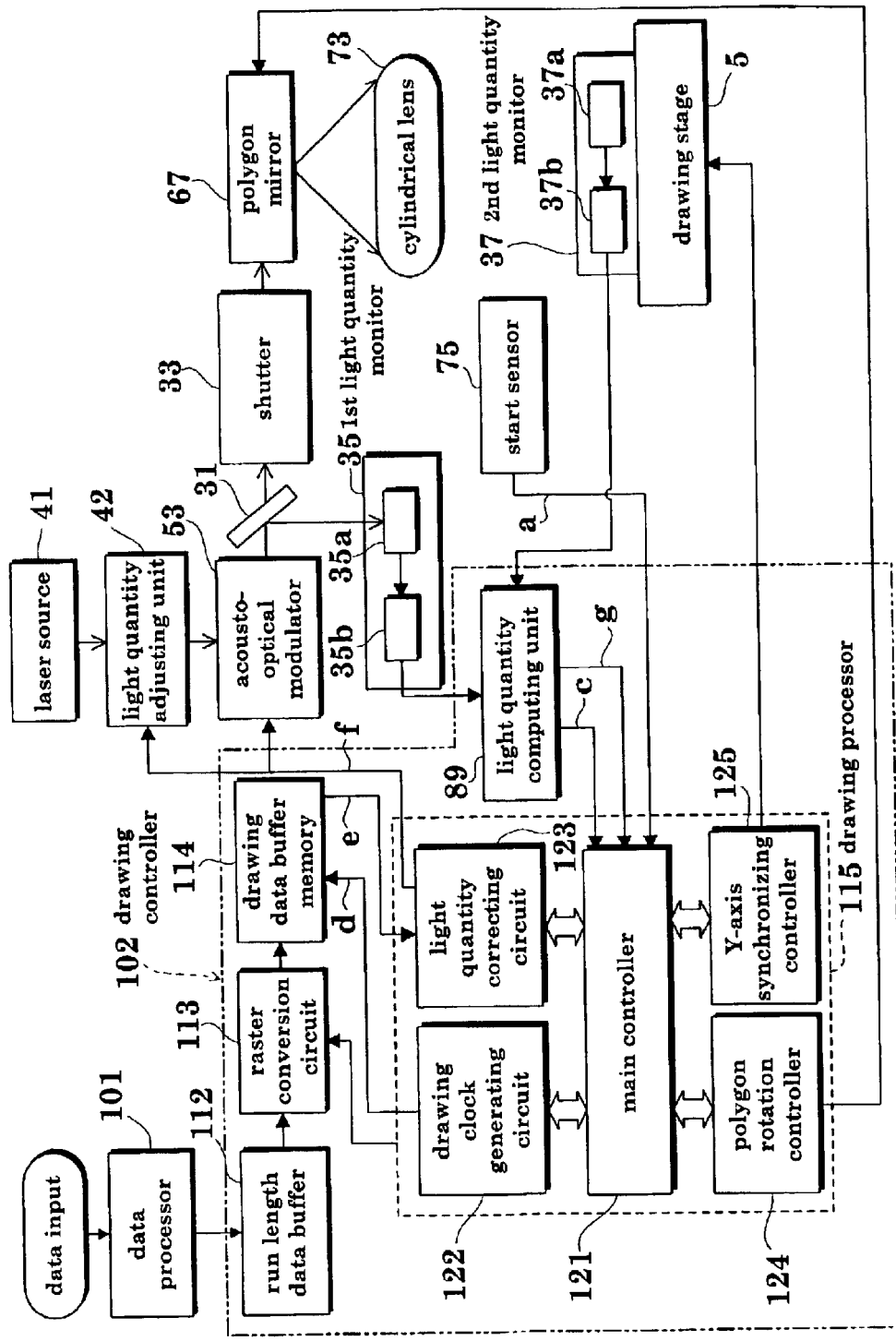
FIG. 4 is a block diagram showing an outline of the laser drawing apparatus shown in FIG. 1.

As shown in FIG. 1, the apparatus in this embodiment further includes a second light quantity monitor 37 disposed, for example, in an imaging area (i.e. a scanning range in the x-direction of the laser beams LB) adjacent the rear end in the secondary scanning direction of the support table 15, for detecting the quantities of laser beams LB. The second light quantity monitor 37 is constructed similar to the above first light quantity monitor 35, and includes a photodiode sensor 37a and an analog-to-digital converter 37b (FIG. 4). The second light quantity monitor 37 corresponds to the second light quantity detecting device of this invention.

Next, the data processor 101 and drawing controller 102 will be described with reference to FIG. 4. FIG. 4 is a block diagram showing an outline of the laser drawing apparatus shown in FIG. 1.

As shown in FIG. 4, the data processor 101 receives artwork data of the printed circuit board designed by using CAD, converts the artwork data into run length data for raster scan drawing, and outputs the run length data to the drawing controller 102. The data processor 101 may, for example, be a workstation, personal computer or the like.

The drawing controller 102 includes the light quantity computing unit 89, a run length data buffer 112, a raster conversion circuit 113, a drawing data buffer memory 114 and a drawing processor 115. These components will be described in order hereinafter.

The light quantity computing unit 89 computes light quantities from voltage values received from the analog-to-digital converter 35b of the first light quantity monitor 35, based on a predetermined conversion formula for the first light quantity monitor 35. The light quantity computing unit 89 further computes light quantity correction data c for correcting the quantities of the laser beams, based on the light quantities (first image surface light quantity values) corresponding to the voltage values detected by the first light quantity monitor 35 and computed based on the above conversion formula for the first light quantity monitor 35, and outputs the light quantity correction data c to the drawing processor 115.

The image surface represents a surface of the image-receiving object on which the laser beams form images. The first image surface light quantity values are what is converted as light quantities on the imaging surface of the image-receiving object.

The run length data buffer 112 once stores all the run length data converted by the data processor 101. The raster conversion circuit 113 converts the run length data successively read, into binary raster data for each pixel. The drawing data buffer memory 114 stores the raster data for each scan.

The drawing processor 115 gives an instruction for raster conversion to the raster conversion circuit 113, reads the raster data stored in the drawing data buffer memory 114 based on a drawing clock signal d from an internal drawing clock generating circuit 122, corrects the voltage (amplitude) of a drawing signal e generated from this raster data, based on the light quantity correction data c from the light quantity computing unit 89, and outputs a corrected drawing signal f to the acousto-optical modulator 53 and light quantity adjusting unit 42. Based on the corrected drawing signal f, the acousto-optical modulator 53 modulates the laser beams (light intensity modulation) from the laser source 41. The quantity of the single laser beam LBa outputted from the laser source 41 is adjusted as appropriate by controlling the pulse motor 42b of light quantity adjusting unit 42.

The construction of the above drawing processor 115 will be described in greater detail. The drawing processor 115 includes a main controller 121, the drawing clock generating circuit 122, a light quantity correcting circuit 123, a polygon rotation controller 124 and a Y-axis synchronizing controller 125. The above drawing processor 115 corresponds to the drawing control device of this invention.

The main controller 121 receives the light quantity correction data c computed by the light quantity computing unit 89, and the scan start signal a detected by the start sensor 75 for each scan. The main controller 121 controls the light quantity correcting circuit 123, polygon rotation controller 124 and Y-axis synchronizing controller 125 based on the drawing clock signal d from the drawing clock generating circuit 122 and the light quantity correction data c from the light quantity computing unit 89.

The drawing clock generating circuit 122 generates the drawing clock signal d, and outputs it to the drawing data buffer memory 114 and main controller 121. The light quantity correcting circuit 123 corrects the drawing signal e outputted from the drawing data buffer memory 114, based on the light quantity correction data c set by the main controller 121, and outputs this corrected drawing signal f to the acousto-optical modulator 53 and light quantity adjusting unit 42. The polygon rotation controller 124 controls rotation of the polygon mirror 67 on an instruction from the main controller 121. The Y-axis synchronizing controller 125 is operable on an instruction from the main controller 121 to drive the drawing stage 5 in the y-direction synchronously with laser drawing.

The photodiode sensor 37a of the second light quantity monitor 37 receives the laser beams LB, converts the intensities of the laser beams LB into voltages, and outputs the voltages to the analog-to-digital converter 37b disposed downstream. The voltages outputted are digitized by the analog-to-digital converter 37b of the second light quantity monitor 37, and outputted to the light quantity computing unit 89. The light quantity computing unit 89 computes light quantities from voltage values received from the analog-to-digital converter 37b of the second light quantity monitor 37, based on a predetermined conversion formula for the second light quantity monitor 37.

The light quantity computing unit 89 determines a difference between each first image surface light quantity value corresponding to a voltage value detected by the first light quantity monitor 35 and computed based on the above conversion formula for the first light quantity monitor 35, and each second image surface light quantity value corresponding to a voltage value detected by the second light quantity monitor 37 and computed based on the above conversion formula for the second light quantity monitor 37, and checks whether the difference exceeds a permissible value or not. When the differences between the first light quantity value and second light quantity value exceeds the permissible value, the light quantity computing unit 89 outputs an instruction g to the main controller 121 of drawing processor 115 for calibrating the first light quantity monitor 35.

Upon receipt of the calibrating instruction g from the light quantity computing unit 89, the main controller 121 controls the drawing stage 5, and controls the light quantity adjusting unit 42 and acousto-optical modulator 53 through the light quantity correcting circuit 123, to measure light quantities individually at the first and second light quantity monitors 35 and 37.

The light quantity computing unit 89 derives a conversion formula for the first light quantity monitor 35 in respect of each channel all over again from results of detection by the first and second light quantity monitors 35 and 37, and stores coefficients of the conversion formula in memory. The above light quantity computing unit 89 and associated components correspond to the calibrating device of this invention.

Figure 5:
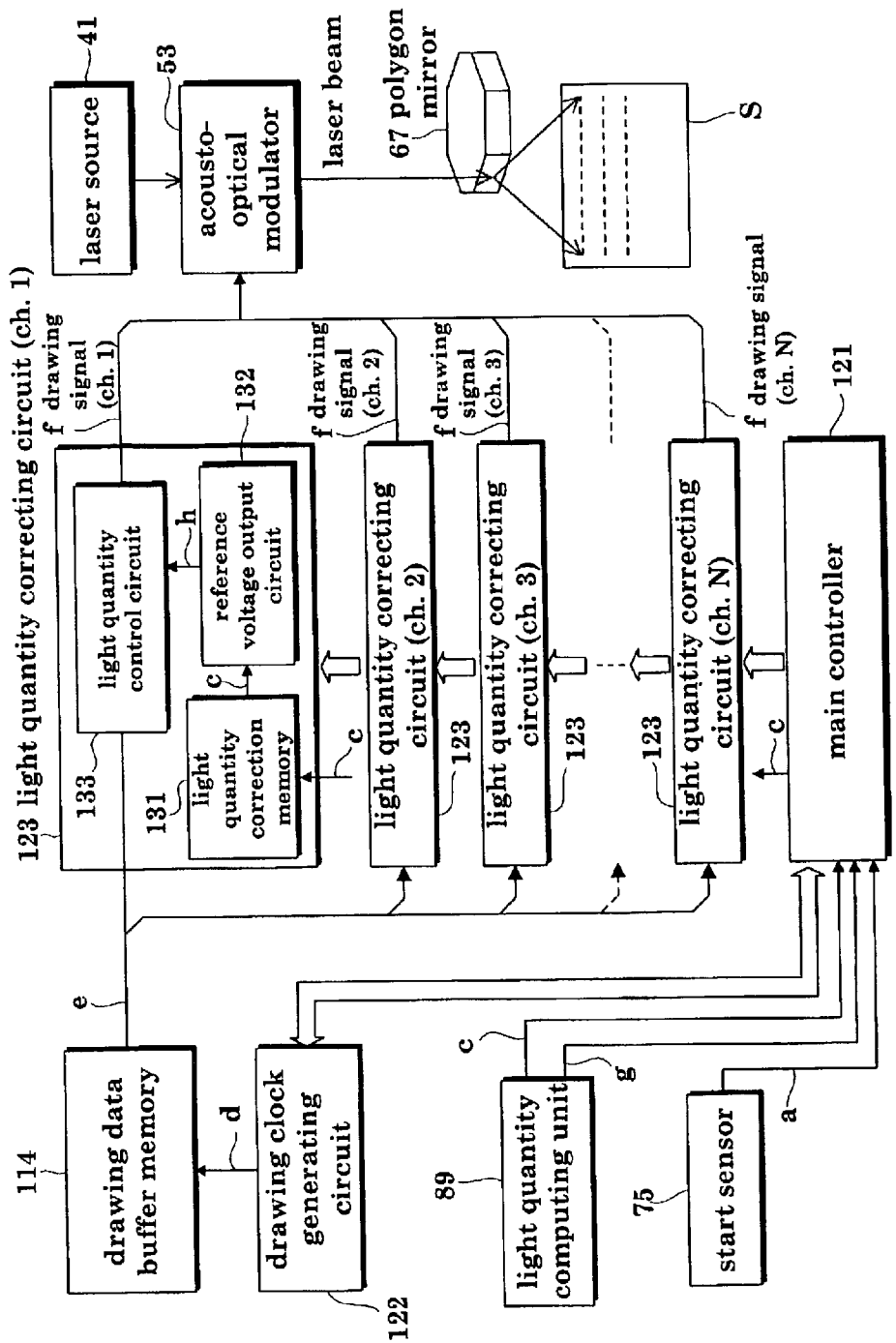
FIG. 5 is a block diagram showing a principal portion of a drawing controller.

Next, the construction of the above light quantity correcting circuit 123 will be described with reference to FIG. 5. FIG. 5 is a block diagram showing a principal portion of the drawing controller 102.

As shown in FIG. 5, the light quantity correcting circuit 123 is provided for each channel of the laser beams. The drawing signal e generated from the raster data for each beam read from the drawing data buffer memory 114 is inputted, on a channel-by-channel basis, to the corresponding light quantity correcting circuit 123. Each light quantity correcting circuit 123 corrects the drawing signal e inputted thereto, based on light quantity correction data c set to itself, and outputs the corrected drawing signal f to the acousto-optical modulator 53. Each light quantity correcting circuit 123 includes a light quantity correction memory 131, a reference voltage output circuit 132 and a light quantity control circuit 133. The main controller 121 sets light quantity correction data c for each channel from the light quantity computing unit 89 to the corresponding light quantity correction memory 131. This light quantity correction data c is used for correcting a light quantity control setting (continuous tone light quantity setting) which is an amplitude of the drawing signal.

The light quantity correction memory 131 stores a light quantity correction value for the laser beam as light quantity correction data c. The reference voltage output circuit 132 generates a reference voltage h for light quantity correction according to the light quantity correction data c read from the light quantity correction memory 131. The light quantity control circuit 133 corrects the light quantity control setting (continuous tone light quantity setting) of the drawing signal e according to the reference voltage h for light quantity correction received from the reference voltage output circuit 132, and outputs the corrected drawing signal f to the acousto-optical modulator 53.

The reference voltage output circuit 132 may, for example, be a digital-to-analog converter for outputting the reference voltage h for light quantity correction, which is analog data, converted from the light quantity correction data c, which is digital data, read from the light quantity correction memory 131. The light quantity control circuit 133 may, for example, be a digital-to-analog converter for correcting, according to the reference voltage h for light quantity correction received from the reference voltage output circuit 132, the light quantity control setting (continuous tone light quantity setting) which is digital data used in generating the drawing signal by applying a continuous tone feature to the raster data read from the drawing data buffer memory 114, and outputting the corrected drawing signal which is analog data.

The corresponding laser beam is modulated by the drawing signal f corrected by each light quantity control circuit 133 as noted above. Each modulated laser beam is emitted to the printed circuit board S to form a drawing pattern with a corrected light quantity on the printed circuit board S.

Next, a laser drawing operation of the above laser drawing apparatus will be described with reference to FIG. 1.

As shown in FIG. 1, a printed circuit board S is placed in a predetermined position on the support table 15 of drawing stage 5 by a board transport mechanism (not shown). A drawing start position is accurately determined, for example, by correcting alignment of the printed circuit board S placed on the support table 15. Then, the drawing stage 5 is moved in the secondary scanning direction (y-direction) under control of the drawing controller 102 to set the printed circuit board S to the processing position PY.

Until the printed circuit board S reaches the processing position PY, the shutter element 33 in the imaging optical system 21 remains closed, and the first light quantity monitor 35 detects the quantities of laser beams LBc. Since the quantities of laser beams LB to be emitted to the printed circuit board S must be controlled with high precision, the first light quantity monitor 35 usually monitors (or detects) the quantities of laser beams LBc in all channels before starting a laser drawing on the printed circuit board S placed on the drawing stage 5.

The drawing controller 102 controls the imaging optical system 21 to scan the laser beams LB in the primary scanning direction (x-direction) over the printed circuit board S, and moves the drawing stage 5 in the secondary scanning direction (y-direction), thereby drawing a predetermined pattern on the printed circuit board S.

The laser drawing apparatus in this embodiment is the multi-beam type for simultaneously emitting a plurality of (e.g. eight in this embodiment) laser beams LB to the printed circuit board S as noted above.

Figure 6:
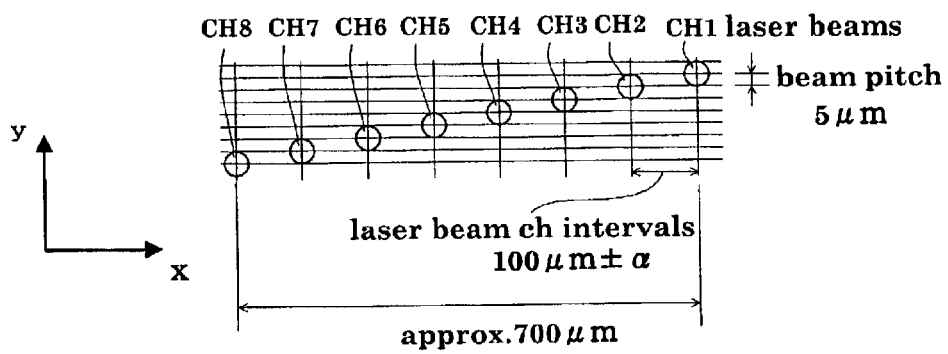
FIG. 6 is a view showing a multi-beam array and beam intervals.

The multiple beams used in this embodiment will be described with reference to FIG. 6. FIG. 6 is a view showing a multi-beam array and beam intervals. As shown in FIG. 6, the multiple beams are arranged at an angle to scan lines in order to avoid mutual interference among the laser beams. Specifically, a distance in the primary scanning direction (x-direction) between adjacent beams is adjusted to approximately 100 $\mu$m, for example, and a distance in the secondary scanning direction (y-direction) between adjacent beams to 5 $\mu$m per pixel in raster drawing. Consequently, distances between beam centers of CH(channel)1 and CH8 of the eight beams are approximately 700 $\mu$m in the x-direction and 35 $\mu$m in the y-direction.

Figure 7:
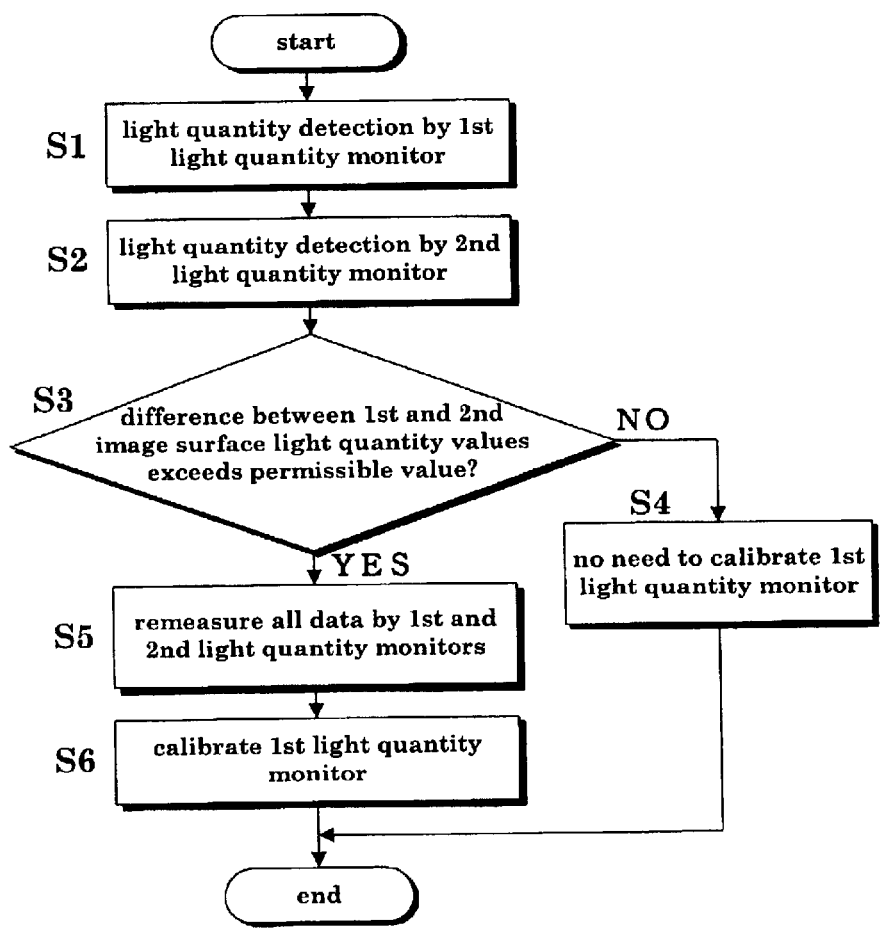
FIG. 7 is a flow chart of a process for calibrating the first light quantity monitor.

Next, an operation of the laser drawing apparatus in this embodiment for calibrating the first light quantity monitor 35 will be described with reference to FIG. 7. FIG. 7 is a flow chart of a process for calibrating the first light quantity monitor 35. The calibration of the first light quantity monitor 35 described hereinafter may be carried out only at a desired time such as at a start-up or routine diagnosis of this apparatus.

Step S1

As described above, the detection of the quantities of laser beams LBc by the first light quantity monitor 35 is carried out when the laser beams LB are not emitted to draw a pattern on the printed circuit board S. The detection of the quantities of laser beams LBc by the first light quantity monitor 35 is carried out, for example, when the drawing stage 5 is in a standby position for loading the printed circuit board S or for detecting alignment of the printed circuit board S, or at other non-drawing time when the drawing stage 5 is moved relative to the imaging optical system 21 from the standby position to the drawing start position. That is, the above detecting operation is carried out by using a period of time when the imaging optical system 21 is on standby. The detection of the quantities of laser beams LBc by the first light quantity monitor 35 is carried out for all of the eight laser beams LBc (ch1 to ch8), one after another, by causing the light quantity adjusting unit 42 and acousto-optical modulator 53 to vary the quantities of laser beams LBc by predetermined increments.

Specifically, the main controller 121 controls the light quantity adjusting unit 42 and acousto-optical modulator 53, as appropriate, through the light quantity correcting circuit 123, that is, rotates the halfwave plate 42a of the light quantity adjusting unit 42 by a predetermined pitch, and controls the modulation output of the acousto-optical modulator 53, to output one of the eight laser beams LBc and vary the quantity of this laser beam LBc by the predetermined increments. The same controls are executed for the remaining seven laser beams LBc. Only one laser beam LBc in the quantity varying by the predetermined increments enters the first light quantity monitor 35 for quantity measurement. That is, exposure spots of the eight laser beams LBc are inputted to the first light quantity monitor 35, one after another, in a predetermined order, to have the quantities measured. This measurement is performed for all the channels individually.

The first light quantity monitor 35 operates, step by step, to detect the laser beams LBc in varying quantities extracted by the beam sampler 31, and output results as voltage values. Each voltage outputted from the first light quantity monitor 35 is used to compute the light quantity (first image surface light quantity value) based on the conversion formula for the first light quantity monitor 35. The first image surface light quantity values computed are used to prepare characteristic lines as shown in FIG. 8. FIG. 8 is a view illustrating a relationship between image surface light quantity value and output voltage of the first light quantity monitor 35.

As shown in FIG. 8, actual light quantities incident on the first light quantity monitor 35 and voltage outputs from the first light quantity monitor 35 are substantially linear, but their proportional relationship deviates slightly, for example, at small light quantities owing to characteristics of the sensor (photodiode sensor in this embodiment) or circuit adjustments. Further, since the eight laser beams LBc all have different angles of incidence on the beam sampler 31, that is since the angle of incidence differs from channel to channel of the laser beams LBc, the above conversion formula for the first light quantity monitor 35 is different for each channel of laser beam LBc. The apparatus in this embodiment, therefore, measures output voltages for all the eight channels (ch1 to ch8) beforehand while varying the incident light quantity, performs a polynomial approximation for each channel, and stores coefficients in the conversion formula for the first light quantity monitor 35 in the memory in the light quantity computing unit 89.

Appropriate exposure light quantity settings are made to the light quantity adjusting unit 42 and acousto-optical modulator 53 based on the above conversion formula for the first light quantity monitor 35, so that the laser beams LB may be emitted in a desired exposure light quantity to the printed circuit board S. The first light quantity value (first image surface light quantity value) corresponding to the laser beams LB set to the desired light quantity value as described above is particularly called "first set light quantity value".

The light quantity detection by the first light quantity monitor 35 in step S1 corresponds to the first detecting step of this invention. The light quantity setting to the light quantity adjusting unit 42 and acousto-optical modulator 53 in step S1 corresponds to the light quantity adjusting step of this invention.

Step S2

Next, only at a desired time such as a start-up or routine diagnosis of this apparatus, the drawing stage 5 is moved to set the second light quantity monitor 37 on the drawing stage 5 to the processing position PY. The second light quantity monitor 37 detects the quantities of laser beams LB actually emitted to the printed circuit board S, and outputs results as voltage values. Each voltage outputted from the second light quantity monitor 37 is used to compute the second light quantity (second image surface light quantity value) based on a conversion formula for the second light quantity monitor 37. The acousto-optical modulator 53 in the imaging optical system 21 is controlled to scan, in the x-direction, and emit exposure spots of the laser beams LB to the second light quantity monitor 37 on the drawing stage 5, and emit only a particular one of the eight laser beams LB to the second light quantity monitor 37. The second light quantity monitor 37 detects the quantity of this laser beam LB. Step S2 corresponds to the second detecting step of this invention.

Step S3

A comparison is made between each first image surface light quantity value (first set light quantity value) obtained by the first light quantity monitor 35 in step S1 and each second image surface light quantity value detected by the second light quantity monitor 37 in step S2, to determine whether a difference between the first image surface light quantity value (first set light quantity value) and second image surface light quantity value exceeds the permissible value.

When, for example, the difference between the first and second image surface light quantity values equals or is less than the permissible value, the operation proceeds to step S4. In this case, the first light quantity monitor 35 is detecting the quantities of laser beams LBc with high accuracy, and hence no need for calibration. Thus, the operation for calibrating the first light quantity monitor 35 is terminated.

Conversely, when the difference between the first and second image surface light quantity values exceeds the permissible value, the accuracy of the first light quantity monitor 35 in detecting the quantities of laser beams LBc has varied and needs to be calibrated. The operation proceeds to step S5.

Step S5

All data are re-measured by the first light quantity monitor 35 and second light quantity monitor 37. First, all data are re-measured by the second light quantity monitor 37. While operating the light quantity adjusting unit 42 to rotate the internal halfwave plate 42a by the predetermined pitch to vary the quantity of laser beam LBa by predetermined increments, that is while varying the quantities of laser beams LB to the second light quantity monitor 37, the second light quantity monitor 37 is operated to detect the laser beams LB. This measurement is performed for all the channels, one after another of the eight laser beams. At this time, the acousto-optical modulator 53 in the imaging optical system 21 is controlled to scan, in the x-direction, and emit exposure spots of the laser beams LB to the second light quantity monitor 37 on the drawing stage 5, and emit only a particular one of the eight laser beams LB to the second light quantity monitor 37. The second light quantity monitor 37 detects the quantity of this laser beam LB.

Next, all data are re-measured by the first light quantity monitor 35. While operating the light quantity adjusting unit 42 to rotate the internal halfwave plate 42a by the predetermined pitch to vary the quantity of laser beam LBa, that is while varying the quantities of laser beams LBc to the first light quantity monitor 35, the first light quantity monitor 35 is operated to detect the laser beams LBc. This measurement is performed for all the channels, one after another of the eight laser beams. The shutter element 33 disposed downstream of the beam sampler 31 is closed when a printed circuit board S (image-receiving object) is present on the drawing stage 5, and is opened in time of this calibrating operation. The laser beams LBc transmitted through the beam sampler 31 are outputted to the cylindrical lens 59. Thus, the laser beams LB are emitted to the drawing stage 5. The imaging optical system 21 is controlled to emit only a particular one of the eight laser beams LB to the first light quantity monitor 35, instead of the exposure spots of the eight laser beams LB being emitted in superimposition. The first light quantity monitor 35 detects the quantity of this laser beam LB.

Step S6

The light quantity computing unit 89 calibrates the first light quantity monitor 35 based on results of detection by the second light quantity monitor 37.

Assume that, as shown in a solid line in FIG. 8, for example, a voltage p1 is outputted originally when the first light quantity monitor 35 detects a particular one of the eight laser beams LBc in the predetermined quantity, and an image surface light quantity value P1 corresponding to the output voltage p1 is appropriately derived from the original conversion formula $P1=F(p1)$ for the first light quantity monitor 35. Assume also that a characteristic deterioration of or adhesion of foreign matter to optical components of the beam sampler 31 or the first light quantity monitor 35 has resulted in variations in the optical characteristic of the first light quantity monitor 35, and variations in the detection by the first light quantity monitor 35 of the quantities of laser beams LBc. Then, as shown in a two-dot chain line in FIG. 8, an image surface light quantity value P1' should be computed as corresponding to the output voltage p1. However, the image surface light quantity value P1 is computed instead. The erroneous difference between the image surface light quantity values P1 and P1' is reflected on the laser beams LB to the printed circuit board S. The light quantities of laser beams LB to the printed circuit board S cannot be controlled with high precision. Thus, when the above step S3 finds the difference between the first and second image surface light quantity values to exceed the permissible value, a current conversion formula $P1'=F'(p1)$ for the first light quantity monitor 35 is obtained based on the re-measurement of all data by the first light quantity monitor 35 and second light quantity monitor 37 performed at step S5 above. The image surface light quantity value P1' corresponding to the output voltage p1 is appropriately computed from the new conversion formula $P1'=F'(p1)$.

These steps S3, S5 and S6 constitute the calibrating step of this invention.

When, in step S3 above, the difference between the first and second image surface light quantity values far exceeds the permissible value, the first light quantity monitor 35 is not to be calibrated. The components of the beam sampler 31 and first light quantity monitor 35 may then be inspected for usability and, if found unusable, may be replaced with new components.

As described above, variations in the optical characteristic of the first light quantity monitor 35 and variations in the detection by the first light quantity monitor 35 of the quantities of laser beams LBc may occur as a result of a characteristic deterioration of, adhesion of foreign matter to or blurring of the optical components of the beam sampler 31 or the first light quantity monitor 35. In such an event, the apparatus in this embodiment is capable of calibrating the accuracy of the first light quantity monitor 35 in detecting the quantities of laser beams LBc based on results of detection by the second light quantity monitor 37 of the quantities of laser beams LB emitted from the imaging optical system 21 to the drawing stage 5. Thus, the quantities of laser beams LB emitted to the printed circuit board S may be adjusted to a proper value, to maintain high-quality, high-definition drawings requiring a high degree of light quantity precision.

The light quantities are detected by using the beam sampler 31 acting as the extracting device included in the imaging optical system 21 acting as the exposing device. This arrangement simplifies the construction. This arrangement has also an advantage of simplifying the light quantity detection in that the drawing stage 5 acting as the holding device need not be operated in time of light quantity detection.

Where the second light quantity monitor 37 is disposed outside the imaging area on the drawing stage 5, the primary scanning range of laser beams LB must be enlarged so that the laser beams LB directly enter the second light quantity monitor 37. This requires a large lens (e.g. the field lens 71) and large deflector (polygon mirror 67) to be used in the imaging optical system 21 for scanning the laser beams LB in the primary scanning direction (x-direction) relative to the printed circuit board S supported by the drawing stage 5. According to the invention, the second light quantity monitor 37 is disposed inside the imaging area on the drawing stage 5, and thus no need to enlarge the primary scanning range of laser beams LB to direct the beams LB to the second light quantity monitor 37. This avoids the enlargement of the lens (e.g. the field lens 71) and deflector (polygon mirror 67) used in the imaging optical system 21.

The accuracy of the first light quantity monitor 35 in detecting the quantities of laser beams LBc may be calibrated also in the laser drawing apparatus for performing multi-beam drawing by scanning a plurality of (eight in this embodiment) laser beams LB over the printed circuit board S supported by the drawing stage 5. Thus, the quantities of laser beams LB emitted to the printed circuit board S may be adjusted to a proper value, to maintain high-quality, high-definition drawings requiring a high degree of light quantity precision.

A checking is made to determine whether the difference between the first light quantity value detected by the first light quantity monitor 35 and the second light quantity value detected by the second light quantity monitor 37 exceeds the permissible value or not. When the difference exceeds the permissible value, the first light quantity monitor 35 is calibrated. Thus, whether a calibration is necessary or not may be determined simply.

The light quantities of laser beams LBc are detected and set to a proper value prior to emission of laser beams LB to the printed circuit board S. This exposure light setting is carried out by the first light quantity monitor 35 when the drawing stage 5 is in the standby position for loading the printed circuit board S or detecting alignment of the printed circuit board S, or at other non-drawing time when the drawing stage 5 is moved relative to the imaging optical system 21 from the standby position to the drawing start position. That is, the setting is carried out efficiently by using a period of time when the imaging optical system 21 is on standby. Further, only at a desired time such as a start-up or routine diagnosis of this apparatus, the drawing stage 5 and imaging optical system 21 are set to a predetermined position, and the second light quantity monitor 37 is operated to detect the quantities of laser beams LB actually emitted to the printed circuit board S. Based on results of the detection, the accuracy of the first light quantity monitor 35 in detecting the quantities of laser beams LBc may be calibrated as appropriate. As a result, the detection by the first light quantity monitor 35 of the quantities of laser beams LBc may be maintained at a high degree of accuracy without lowering throughput of the apparatus.

Since the second light quantity monitor 37 is disposed on the drawing stage 5 as noted hereinbefore, the second light quantity monitor 37 can detect image surface light quantity values of laser beams LB on the printed circuit board S placed on the drawing stage 5, i.e. detect the second image surface light quantity values of laser beams LB adjacent a final image surface. As a result, even when deterioration of, or adhesion of foreign matter to, the optical components such as the polygon mirror 67, fθ lens 68 and cylindrical lens 73 arranged downstream of the beam sampler 31 results in variations in the optical characteristics of these optical components, the second light quantity monitor 37 can detect the second image surface light quantity values in a way to accommodate such variations. Thus, the second light quantity monitor 37 can detect the second image surface light quantity values substantially corresponding to the quantity values of laser beams LB actually emitted to the printed circuit board S. By calibrating the light quantity detecting accuracy of the first light quantity monitor 35 based on the second image surface light quantity values, the quantities of laser beams LB emitted to the printed circuit board S may be adjusted to a proper value reliably.

The present invention may be modified as follows:

(1) In the foregoing embodiment, the imaging optical system 21 is fixed while the drawing stage 5 is movable. The invention is applicable also where, conversely, the imaging optical system 21 is adapted movable relative to the drawing stage 5.

(2) The foregoing embodiment uses the laser light source 41 and acousto-optical modulator 53. These components may be replaced by a laser diode. In this case, the laser diode may only be on-off controlled directly, which contributes to a simplified construction.

(3) In the foregoing embodiment, part of the laser beams LBc in the adjusted quantities are separated and extracted for detection by the first light quantity monitor 35 within the imaging optical system 21. The separating and extracting position is not limited to that within the imaging optical system 21. The laser beams LB after the light quantity adjustment may be detected by the first light quantity monitor 35 outside the imaging optical system 21. As long as the first light quantity monitor 35 is fixed relative to the imaging optical system 21, the first light quantity monitor 35 may be regarded as being included in the exposing device.

(4) In the foregoing embodiment, part of the laser beams LBc in the adjusted quantities are extracted by the beam sampler 31 acting as the extracting device, for detection by the first light quantity monitor 35. Alternatively, at least part of the laser beams LBc in the adjusted quantities may be reflected by a mirror or the like acting as the extracting device, for detection by the first light quantity monitor 35.

(5) In the foregoing embodiment, the second light quantity monitor 37 is provided as a component of the drawing stage 5. Instead, the second light quantity monitor 37 may be made available for placement on the drawing stage 5, as appropriate, when detecting the light quantities of laser beams LB emitted to the printed circuit board S.

The present invention may be embodied in other specific forms without departing from the spirit or essential attributes thereof and, accordingly, reference should be made to the appended claims, rather than to the foregoing specification, as indicating the scope of the invention.

What is claimed is:

1. A laser drawing apparatus for drawing a desired pattern on an image-receiving object by scanning the object with a laser beam, said apparatus comprising:

holding means for holding said image-receiving object;

exposing means having light quantity adjusting means for adjusting quantity of said laser beam, extracting means for extracting at least part of said laser beam in the quantity adjusted by said light quantity adjusting means, and first light quantity detecting means for detecting quantity of the laser beam extracted by said extracting means, said laser beam in the quantity adjusted by said light quantity adjusting means being scanned in a primary scanning direction over said image-receiving object held by said holding means;

moving means for moving said holding means relative to said exposing means in a secondary scanning direction perpendicular to said primary scanning direction;

drawing control means for controlling said exposing means and said moving means;

second light quantity detecting means disposed on said holding means for directly detecting the quantity of said laser beam emitted from said exposing means toward said holding means; and calibrating means for calibrating said first light quantity detecting means based on results of detection by said first light quantity detecting means and results of detection by said second light quantity detecting means.

2. A laser drawing apparatus as defined in claim 1, wherein said second light quantity detecting means is disposed in an imaging area on said holding means.

3. A laser drawing apparatus as defined in claim 1, wherein:

said exposing means is means for emitting a plurality of laser beams toward said image-receiving object held by said holding means;

said drawing control means is arranged to control said exposing means and said moving means for directing said laser beams, one by one, to said first light quantity detecting means and said second light quantity detecting means;

said first light quantity detecting means and said second light quantity detecting means are arranged to detect quantities of said laser beams, one by one, respectively; and said calibrating means is arranged to calibrate said first light quantity detecting means for each of said laser beams based on results of detection of each of said laser beams detected by said first light quantity detecting means and said second light quantity detecting means.

4. A laser drawing apparatus as defined in claim 2, wherein:

said exposing means is means for emitting a plurality of laser beams toward said image-receiving object held by said holding means;

said drawing control means is arranged to control said exposing means and said moving means for directing said laser beams, one by one, to said first light quantity detecting means and said second light quantity detecting means;

said first light quantity detecting means and said second light quantity detecting means are arranged to detect quantities of said laser beams, one by one, respectively; and said calibrating means is arranged to calibrate said first light quantity detecting means for each of said laser beams based on results of detection of each of said laser beams detected by said first light quantity detecting means and said second light quantity detecting means.

5. A laser drawing apparatus as defined in claim 1, wherein said calibrating means is arranged to determine whether a difference between a first light quantity value detected by said first light quantity detecting means and a second light quantity value detected by said second light quantity detecting means exceeds a permissible value, and to calibrate said first light quantity detecting means when said permissible value is exceeded.

6. A laser drawing apparatus as defined in claim 3, wherein said calibrating means is arranged to determine whether a difference between a first light quantity value detected by said first light quantity detecting means and a second light quantity value detected by said second light quantity detecting means exceeds a permissible value, and to calibrate said first light quantity detecting means when said permissible value is exceeded.

7. A laser drawing apparatus as defined in claim 4, wherein said calibrating means is arranged to determine whether a difference between a first light quantity value detected by said first light quantity detecting means and a second light quantity value detected by said second light quantity detecting means exceeds a permissible value, and to calibrate said first light quantity detecting means when said permissible value is exceeded.

8. A laser drawing apparatus as defined in claim 1, wherein said extracting means is a beam sampler for separating and extracting part of said laser beam.

9. A laser drawing apparatus as defined in claim 5, wherein said extracting means is a beam sampler for separating and extracting part of said laser beam.

10. A laser drawing apparatus as defined in claim 6, wherein said extracting means is a beam sampler for separating and extracting part of said laser beams.

11. A laser drawing apparatus as defined in claim 7, wherein said extracting means is a beam sampler for separating and extracting part of said laser beam.

12. A laser drawing apparatus as defined in claim 1, wherein said light quantity adjusting means includes a light quantity adjusting unit for adjusting quantity of the laser beam inputted thereto and outputting said laser beam, and an acousto-optical modulator for modulating said laser beam.

13. A laser drawing apparatus as defined in claim 5, wherein said light quantity adjusting means includes a light quantity adjusting unit for adjusting quantity of the laser beam inputted thereto and outputting said laser beam, and an acousto-optical modulator for modulating said laser beam.

14. A laser drawing apparatus as defined in claim 8, wherein said light quantity adjusting means includes a light quantity adjusting unit for adjusting quantity of the laser beam inputted thereto and outputting said laser beam, and an acousto-optical modulator for modulating said laser beam.

15. A laser drawing apparatus as defined in claim 12, wherein said light quantity adjusting unit includes a halfwave plate, a pulse motor for rotating said halfwave plate about an optical axis, and a polarization beam splitter.

16. A laser drawing apparatus as defined in claim 13, wherein said light quantity adjusting unit includes a halfwave plate, a pulse motor for rotating said halfwave plate about an optical axis, and a polarization beam splitter.

17. A laser drawing apparatus as defined in claim 14, wherein said light quantity adjusting unit includes a halfwave plate, a pulse motor for rotating said halfwave plate about an optical axis, and a polarization beam splitter.

18. A laser drawing apparatus as defined in claim 1, wherein said holding means includes a drawing stage for supporting said image-receiving object.

19. A laser drawing apparatus as defined in claim 12, wherein said holding means includes a drawing stage for supporting said image-receiving object.

20. A laser drawing method for drawing a desired pattern on an image-receiving object by scanning the object with a laser beam, said method comprising:

a first detecting step for operating extracting means to extract at least part of the laser beam in a quantity adjusted by light quantity adjusting means, and operating first light quantity detecting means to detect quantity of the extracted part of the laser beam;

a light quantity adjusting step for adjusting said light quantity adjusting means based on results of detection obtained in said first detecting step;

a second detecting step for operating second light quantity detecting means to detect directly a substantive quantity of the laser beam reaching the image-receiving object after the quantity is adjusted by said light quantity adjusting means; and a calibrating step for calibrating said light quantity adjusting step based on results of detection obtained in said first detecting step and said second detecting step.

* * * * *